United States Patent
Daoud et al.

(10) Patent No.: US 6,859,605 B2
(45) Date of Patent: Feb. 22, 2005

(54) AUTOMATIC SEALING MECHANISM FOR OPTICAL INTERCONNECTION UNITS

(75) Inventors: Bassel H. Daoud, Parsippany, NJ (US); Ivan Pawlenko, Holland, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/448,855

(22) Filed: May 30, 2003

(65) Prior Publication Data

US 2004/0240827 A1 Dec. 2, 2004

(51) Int. Cl.$^7$ .................................................. G02B 6/00
(52) U.S. Cl. ...................................... 385/135; 439/136
(58) Field of Search ................................ 385/135, 136, 385/147; 174/60, 65 R, 58, 65 G; 439/136, 137

(56) References Cited

U.S. PATENT DOCUMENTS

| | | | | | |
|---|---|---|---|---|---|
| 4,591,658 | A | * | 5/1986 | Bauer et al. | 174/65 R |
| 5,313,546 | A | * | 5/1994 | Toffetti | 385/135 |
| 5,898,129 | A | * | 4/1999 | Ott et al. | 174/59 |
| 5,945,633 | A | * | 8/1999 | Ott et al. | 174/59 |
| 6,177,633 | B1 | * | 1/2001 | Gretz | 174/65 G |
| 6,265,670 | B1 | * | 7/2001 | Duesterhoeft et al. | 174/152 G |
| 6,310,290 | B1 | * | 10/2001 | Gretz | 174/65 R |
| 6,351,592 | B1 | * | 2/2002 | Ehn et al. | 385/135 |
| 6,369,321 | B1 | * | 4/2002 | Flegel | 174/50 |
| 6,388,891 | B1 | * | 5/2002 | Falkenberg et al. | 361/796 |

* cited by examiner

Primary Examiner—Javaid H. Nasri

(57) ABSTRACT

Optical fiber closure having a biased door adapted to cover a portion of an aperture not occupied by an optical fiber. The optical fiber closure has a wall. The wall has an aperture defined therein for receiving optical fibers. The wall also has a biased door adapted to cover a portion of the aperture not occupied by optical fibers.

14 Claims, 5 Drawing Sheets

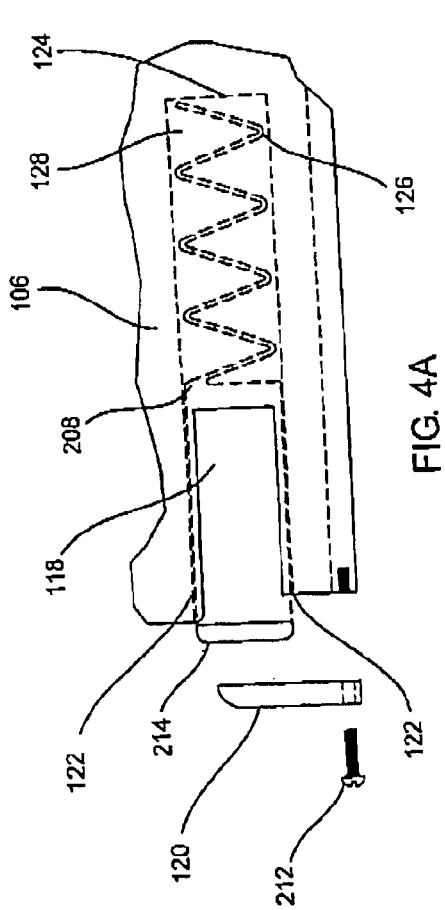
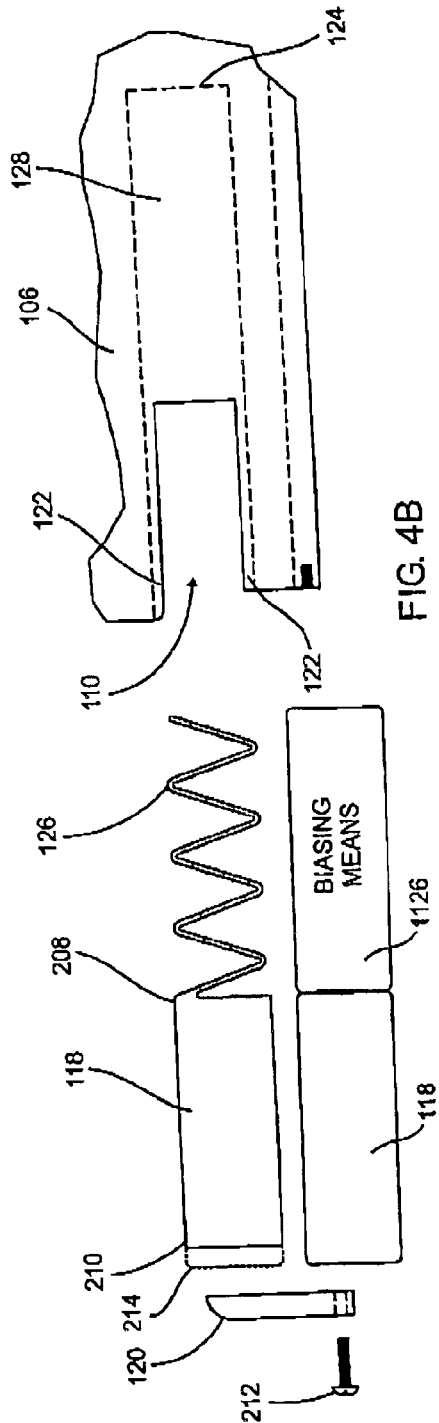
FIG. 4A
FIG. 4B

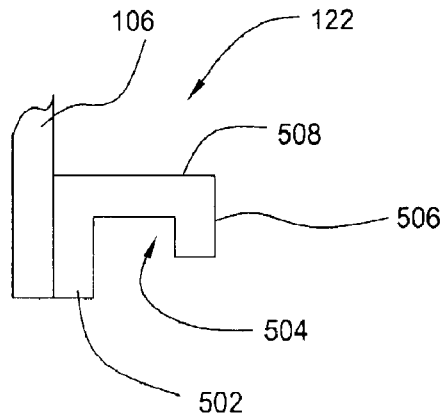
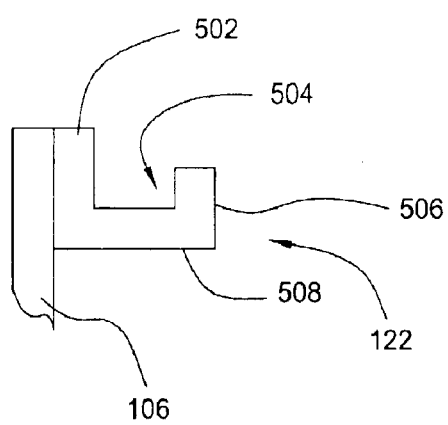
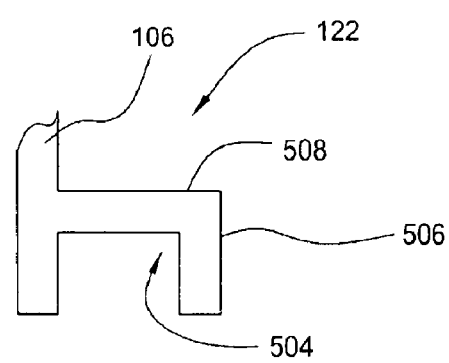
FIG. 5
FIG. 6

AUTOMATIC SEALING MECHANISM FOR OPTICAL INTERCONNECTION UNITS

BACKGROUND OF THE INVENTION

1. Field of the Invention

The present invention generally relates to optical fiber enclosures and, more particularly, to an optical fiber closure providing improved protection from environmental contaminants.

2. Description of the Related Art

Optical closures are essential to the protection of optical fiber. It is desirable to seal the closure to prevent exposure of the interior compartment of the closure and the optical fibers contained therein to undesirable and potentially damaging environmental contaminants. Contaminants may include dust particles, water vapor or condensation, dust, fumes, smoke, particulate matter, or other pollutants. Such contaminants may reduce the light signal transmission strength sufficiently to render an optical device unreliable. For example, one micron particles of dust, debris or other contaminants may settle on or be attracted to optical surfaces. By coating the optical surface or blocking a portion of the light path, the optical strength of a signal passing therethrough may be greatly diminished.

SUMMARY OF THE INVENTION

These and other deficiencies of the prior art are addressed by the present invention of a biased door that allows optical fibers to enter an optical fiber closure while keeping out contaminants. In one embodiment, the biased door is disposed on a sidewall within the optical fiber closure. The biased door is adapted to cover a portion of an aperture not occupied by the at least one optical fiber.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings.

FIGS. 4A–4B depict exploded views of the embodiment of the biased door depicted in FIG. 3;

FIG. 5 depicts an embodiment of substantially parallel tracks in accordance with the invention; and FIG. 6 depicts another embodiment of substantially parallel tracks in accordance with the invention.

DETAILED DESCRIPTION OF THE PREFERRED EMBODIMENT

An optical fiber closure having improved protection against environmental contaminants is described. In the following description, numerous specific details are set forth to provide a more thorough understanding of the invention. Various changes using different configurations of a biased door with respect to the optical fiber closure may be made without departing from the scope of the invention. In other instances, well-known features have not been described in order to avoid obscuring the invention. Thus, the invention is not considered limited to the particular illustrative embodiments shown in the specification and all such alternate embodiments are intended to be included in the scope of this invention.

Figure 1:
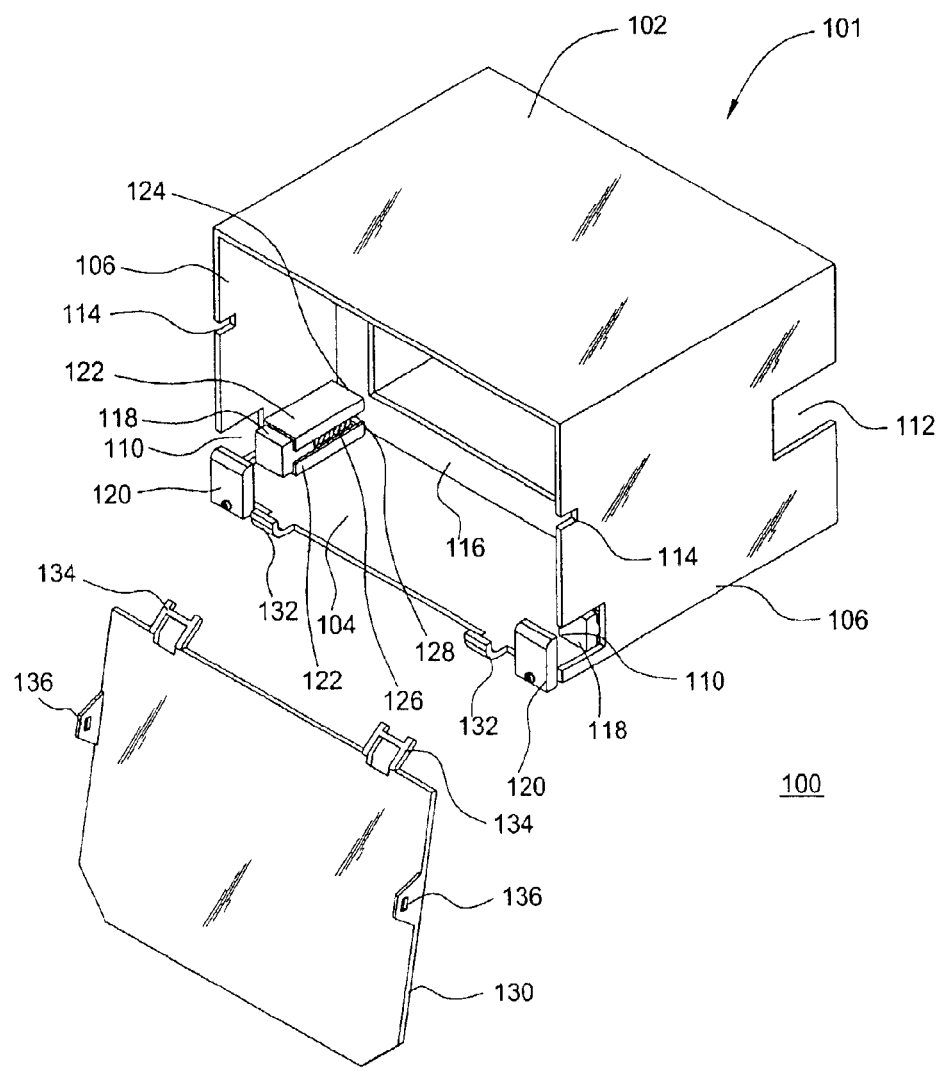
FIG. 1 depicts a perspective view of an optical fiber closure in accordance with the invention.

FIG. 1 is a perspective view of an optical fiber closure 100, in accordance with an embodiment of the invention. The optical fiber closure 100 includes a housing 101; and is adapted to receive a front cover 130 and a rear cover (not shown). The housing 101 is formed of sheet metal, plastic, or like-type materials known to those skilled in the art. The housing 101 includes a top 102, a bottom 104, opposing sidewalls 106, and male hinge members 132. The housing 101 includes a partition 116 mounted therein for supporting optical connector panels. In addition, each opposing sidewall 106 contains a female latch receptacle 114 for securing either the front cover 130 or a rear cover (not shown) to the housing 101. Each of the opposing sidewalls 106 illustratively includes apertures 110 and 112 defined therein through which optical fibers may pass. Each aperture 110 has associated with it a biased door 118 adapted to close or substantially seal an unused portion of the respective aperture 110. The biased door 118 moves laterally, within a trough 128, between a doorstop 120 and a substantially perpendicular end member 124. A spring 126 provides a bias that urges the biased door 118 towards the doorstop 120. The trough 128 is formed by substantially parallel tracks 122 which terminate at the substantially perpendicular end member 124. The biased door 118 is described in more detail below with respect to FIGS. 2–6.

The front cover 130 includes female hinge members 134 and male latches 136. The female hinge members are adapted to receive and pivot about the male hinge members 132. The interaction of the female 134 and male 132 hinge members allows the front cover 130 to pivot between a closed position and an open position. The female latch receptacles 114 are adapted to receive the male latches 136. The interaction between the male latches 136 and female latch receptacles 114 secures the front cover 130 in the closed position.

Figure 2:
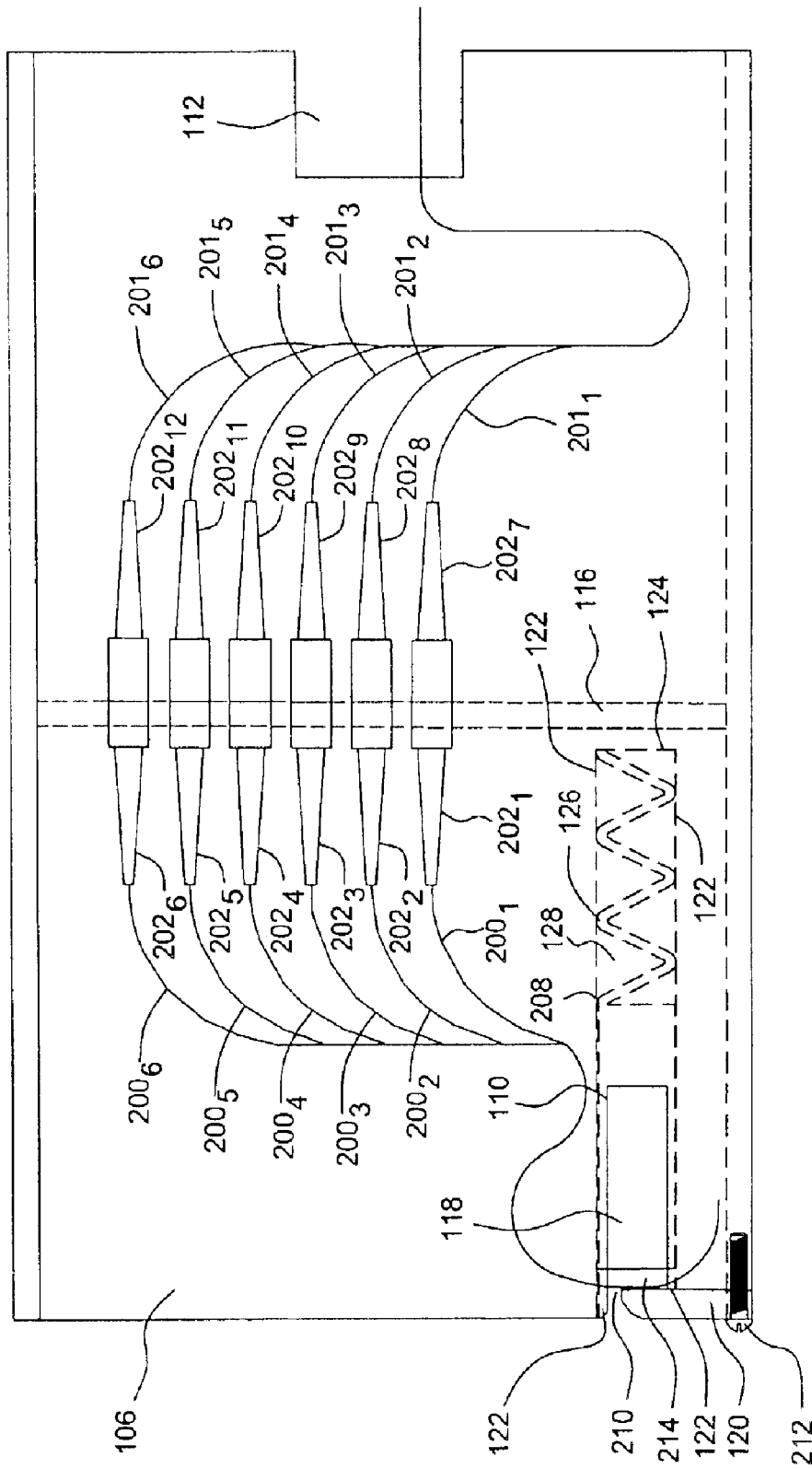
FIG. 2 depicts a side view of the optical fiber closure depicted in FIG. 1, in accordance with the invention.

FIG. 2 depicts a side view of the housing 101 of FIG. 1. For illustrative purposes, FIG. 2 depicts one of the opposing walls 106 as being substantially transparent. As such, various components within the housing 101 and sidewall 106 are viewable. FIG. 4A depicts a partially exploded view of biased door 118 disposed within trough 128 on sidewall 106. FIG. 4B depicts another partially exploded view with the biased door 118 outside of the trough 128. The reader may refer to FIGS. 1, 2, 4A, and 4B simultaneously. FIGS. 4A and 4B are described in more detail below.

Again referring to FIG. 2, a plurality of optical fibers $200_1$–$200_6$ (collectively optical fibers 200) is connected to a corresponding plurality of optical fibers $201_1$–$201_6$ (collectively optical fibers 201) via optical fiber connectors $202_1$–$202_{12}$ (collectively optical fiber connectors 202). The optical fiber connectors 202 are secured to panel 116 within the optical fiber closure 100. Optical fibers 200 and 201 exit housing 101 through apertures 110 and 112 respectively. The biased door 118 closes a portion of aperture 110 not utilized by the optical fibers 200. Aperture 112 has been depicted as not having a biased door 118. However, this depiction is for clarity of the drawings. It is noted that aperture 112 optionally includes a respective biased door 118 in accordance with the invention.

Aperture 110 exposes a portion of the trough 128. Biased door 118, in its maximum extended position, closes aperture 110. In the closed (maximally extended) position, biased door 118 prevents unwanted contaminants from entering the optical fiber closure 100. While closed, a proximal end 210 of the biased door 118 is in close proximity to doorstop 120. The doorstop 120 is formed sheet metal, rigid plastic, or like type material. The doorstop 120 is illustratively secured to sidewall 106 by a screw 212. It is noted that doorstop 120 can be secured to opposing sidewalls 106 by various other means (e.g., by an adhesive). To open aperture 110, a force is applied to the biased door 118 causing the biased door 118 to slide within the trough 128 created by the substantially parallel tracks 122 and substantially perpendicular end member 124, and thereby open a desired portion of aperture 110.

Illustratively, a distal end 208 at the biased door 118 is depicted as transitioning to a spring 126. However, that depiction is not intended in any way to limit the scope of the invention. It is noted that distal end 208, in other embodiments, transitions to any biasing means that urges the proximal end 210 towards doorstop 120. For example, the distal end 208 transitions to a coiled spring 126, as depicted in FIG. 1, in one embodiment and to other types of springs (e.g., a zig-zag spring or a leaf spring) in other embodiments. The spring 126 is made of any rigid material (e.g., metal, including but not limited to aluminum or steel; or plastic) which when formed has a memory which urges the biased door 118 towards doorstop 120.

The spring 126 and the biased door 118 are depicted as a unitary piece for illustrative purposes only. In various embodiments, the biasing means and biased door 120 are separate pieces (e.g., the spring 126 and biased door 118 are separately formed). In addition, the biased door 118 and the biasing means (e.g., spring 126) are composed of the same materials as each other in various embodiments and in other embodiments are composed of different materials from one another.

In still further embodiments, the biasing means 1126 is compressed air enclosed within a pliable housing. As the biased door 118 is moved laterally toward the substantially perpendicular end member 124, the pliable housing expands within the trough 128. The trough 128 is defined by the substantially parallel tracks 122 and substantially perpendicular end member 124 and limits the expansion of the pliable housing. The elasticity of the pliable housing and trough 128 provide a counter-force to the laterally moved biased door 118. As such, the pliable housing and trough 128 urges the biased door 118 towards the doorstop 120.

As the biased door 118 is moved towards the substantially perpendicular piece 124, the spring 126 is forced against the substantially perpendicular end member 124. Optical fibers 200 are inserted into optical fiber closure 100 through aperture 110. The spring 126 provides an opposing counter force, which urges the proximal end 210 towards the doorstop 120. The opposing force created by the spring 126 forces the optical fibers 200 disposed within aperture 110 against the doorstop 120. As a result, the portion of the aperture 110 not occupied by the optical fibers 200 is closed.

The proximal end 210 optionally contains a gasket 214. Optional gasket 214 is secured to the proximal end 210 and is made of any material (e.g., foam or neoprene), which substantially conforms to the shape of the periphery of the optical fibers 200 disposed within aperture 110. In other embodiments, an optional gasket is secured to the doorstop 120.

Figure 3:
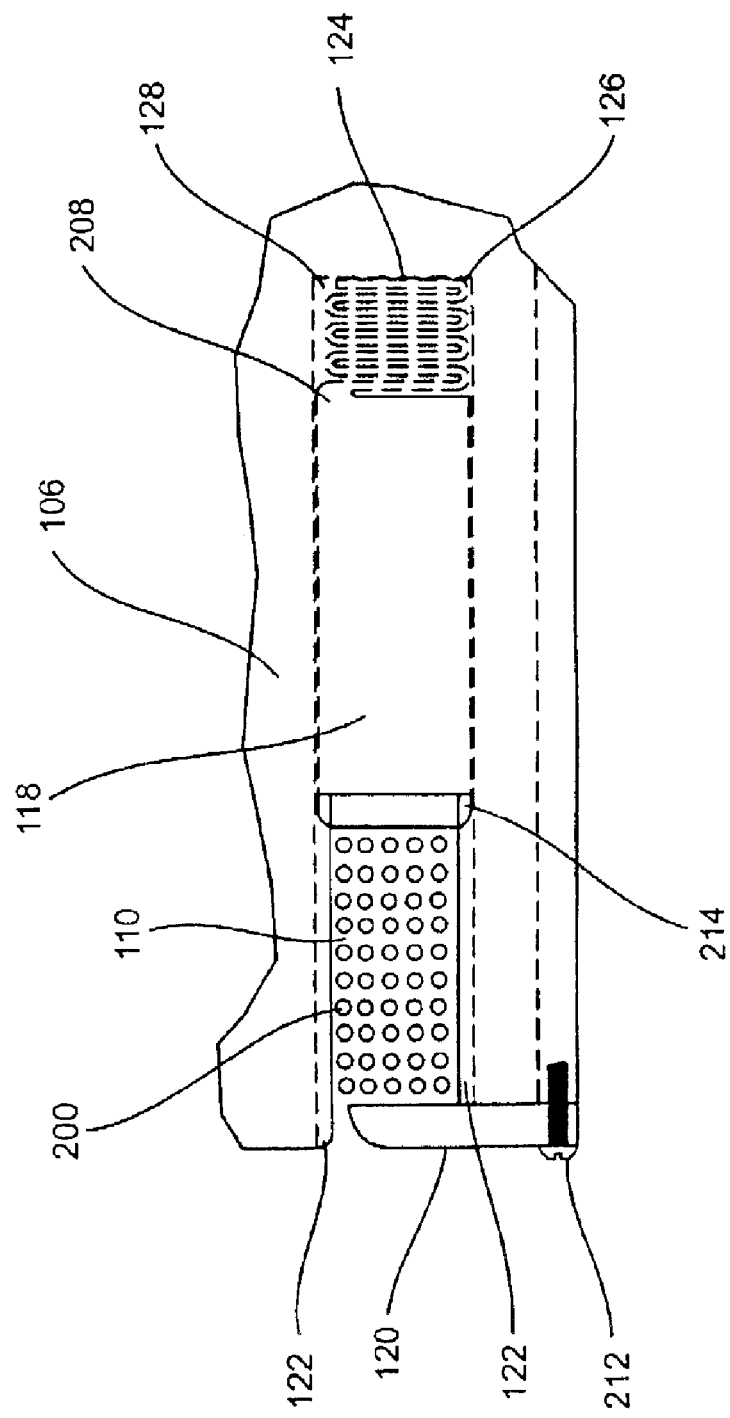
FIG. 3 depicts a close-up view of an embodiment of a biased door in accordance with the invention.

FIG. 3 depicts a detailed side view of a portion of sidewall 106 having an exemplary biased door with the spring 126 fully depressed. Specifically, a force is applied to the biased door 118 causing the biased door 118 to move laterally within trough 128 along tracks 122. In the full depression of the spring 126 indicates that the biased door 118 is at a furthest position away from doorstop 120. As such, the biased door 118 allows a maximum number of optical fiber 200 to enter the optic fiber closure 100 via aperture 110.

FIGS. 4A–4B depict partially exploded views of an exemplary biased door 118 and sidewall 106. Specifically, FIG. 4A depicts biased door 118 within trough 128. The trough 128 is defined by substantially parallel tracks 122 which terminate at a substantially perpendicular end member 124. The biased door 118 has a proximal end 210 and a distal end 208. The distal end 208 transitions to a spring 126. FIG. 4A depicts the spring 126 fully extended within trough 128. The doorstop 120 is shown detached from sidewall 106. A screw 212 is also shown detached from the doorstop 120 and sidewall 106. The doorstop 120 is used to limit the movement of the biased door 118 within the trough 128. In this embodiment, screw 212 is used to secure the doorstop 120 to sidewall 106. In other embodiments, it is noted that doorstop 120 is secured to sidewall 106 by other means (e.g., by an adhesive).

FIG. 4B depicts biased door 118, doorstop 120, and screw 212 fully detached from sidewall 106. The biased door 118 is shown outside of trough 128. FIG. 4B depicts the screw 212 unscrewed from sidewall 106. Further, the doorstop 120 is detached from sidewall 106 and the biased door 118 is outside of trough 128. All of the remaining elements in FIG. 4B have already been discussed with respect to FIGS. 1, 2, 3, and 4A. As such, those elements will not be further discussed with respect to 4B.

FIGS. 1–4 depict the biased door 118 located within optical fiber closure 100. However, in other embodiments, the biased door 118 is on the outside of optical fiber closure 100. As such, substantially perpendicular end member 124, substantially parallel tracks 122, and biased door 118 are positioned on the outside of optic fiber closure 100.

FIG. 5 depicts a front view of an opposing sidewall 106 with one embodiment of the substantially parallel tracks 122 used to create trough 128. Each of the substantially parallel tracks 122 is joined to sidewall 106 via an adjoining member 502. Each adjoining member 502 is substantially parallel to sidewall 106. An extension member 508 extends away from sidewall 106 and adjoining member 502. At its maximum extension, extension member 508 has attached thereto a substantially perpendicular guard 506. Guard 506 is substantially parallel with opposing sidewall 106 and adjoining member 502. The combination of adjoining member 502, extension member 508, and guard 506 form a recess 504 for the disposition of biased door 118 therein.

Although FIG. 5 depicts guard 506 as substantially parallel with sidewall 106 and adjoining member 502; and extension member 508 as substantially perpendicular to adjoining member 502 and guard 506 this depiction is for illustrative purposes only. It is noted that various geometric combinations can be used create tracks 122 in accordance with the invention. In addition, tracks 122 can be created by various means (e.g., injection molded during formation of the sidewall 106).

FIG. 6 depicts another embodiment of track members 122 suitable for, use with the invention. Many of the elements in FIG. 6 have already been discussed with respect to FIG. 5. For brevity, the elements already discussed in FIG. 5 will not be repeated in the discussion of FIG. 6. When necessary, the reader is encouraged to refer to FIG. 5. The embodiment depicted in FIG. 6 differs from the embodiment depicted in FIG. 5 in that the substantially parallel tracks 122 do not have adjoining members 502. Further, extension member 508 is directly connected to and substantially perpendicular with sidewall 106.

While foregoing is directed to the preferred embodiment of the present invention, other and further embodiments of the invention may be devised without departing from the basic scope thereof, and the scope thereof is determined by the claims that follow.

What is claimed is:

1. Apparatus, comprising: a housing having a wall, said wall having an aperture defined therein for receiving at least one optical fiber; and a biased door slidable across the aperture and adapted to cover a portion of said aperture not occupied by said at least one optical fiber when the at least one optical fiber is positioned between the biased door and an edge of the aperture, so that the at least one optical fiber is forced against the edge of the aperture by the biased door.

2. The apparatus of claim 1 wherein said biased door comprises:
   a proximal end and a distal end, said proximal distal end being in communication with a spring, said proximal end partially adapting to a contour of said at least one optical fiber.

3. The apparatus of claim 2 wherein said proximal end has a material disposed thereon for at least partially adapting to a contour of said at least one optical fiber.

4. The apparatus of claim 2 wherein said spring comprises at least one of a coiled spring and a zig-zag spring.

5. The apparatus of claim 3 wherein said biased door and said spring are made of the same material.

6. The apparatus of claim 4 wherein the spring is made of a rigid material.

7. Apparatus comprising:
   a housing having a wall, said wall having an aperture defined therein for receiving at least one optical fiber; and
   a biased door slidable across the aperture and adapted to cover a portion of said aperture not occupied by said at least one optical fiber when the at least one optical fiber is positioned between the biased door and an edge of the aperture, wherein said biased door comprises a proximal end and a distal end, said proximal end being in communication with a pliable housing adapted to expand in response to receiving a gas.

8. The apparatus of claim 1 further comprising:
   a member secured to said wall for enclosing said aperture and for limiting movement of said biased door.

9. The apparatus of claim 8 wherein said member is secured to said wall using at least one of a fastener and an adhesive.

10. The apparatus of claim 1 wherein said biased door moves laterally within a pair of substantially parallel tracks inside said housing.

11. The apparatus of claim 1, wherein:
   said wall has formed therein at least one other aperture adapted to receive at least one optical fiber; and
   a biased door for said at least one other aperture slidable across the at least one other aperture and adapted to cover a portion of said at least one other aperture not occupied by said at least one optical fiber when the at least one optical fiber is positioned between the biased door and an edge of the at least one other aperture.

12. An optical fiber closure, comprising: a housing having a wall, said wall having an aperture defined therein adapted to receive at least one optical fiber, and a biased door slidable across the aperture and adapted to cover a portion of said aperture not occupied by said at least one optical fiber when the at least one optical fiber is positioned between the biased door and an edge of the aperture, so that the at least one optical fiber is forced against the edge of the aperture by the biased door.

13. The closure of claim 12 wherein said biased door comprises:
   a proximal end and a distal end, said distal end having a spring thereon, said proximal end partially adapts to a contour of said at least one optical fiber.

14. The closure of claim 13 wherein said proximal end has a material disposed thereon for partially adapting to a contour of said at least one optical fiber.

* * * * *